(12) United States Patent
D'Aquino

(10) Patent No.: US 7,403,069 B2
(45) Date of Patent: Jul. 22, 2008

(54) TRIFFERENTIAL AMPLIFIER AND TRIFFERENTIAL AMPLIFIER SYSTEM

(75) Inventor: Stefano D'Aquino, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 118 days.

(21) Appl. No.: 11/524,016

(22) Filed: Sep. 20, 2006

(65) Prior Publication Data

US 2008/0068075 A1    Mar. 20, 2008

(51) Int. Cl.
*H03F 3/00* (2006.01)
(52) U.S. Cl. ........................ 330/147; 330/148
(58) Field of Classification Search ................ 330/147, 330/148, 69, 103
See application file for complete search history.

(56) References Cited

U.S. PATENT DOCUMENTS

| 3,849,734 A * | 11/1974 | Grass | 330/252 |
| 5,148,121 A * | 9/1992 | Uchida | 330/295 |
| 6,727,749 B1 * | 4/2004 | Quinn | 330/9 |

* cited by examiner

*Primary Examiner*—Henry K Choe
(74) *Attorney, Agent, or Firm*—Iandiorio Teska & Coleman

(57) ABSTRACT

A multi-fferential amplifier system includes an amplifier having a plurality of amplifier inputs and a plurality of amplifier outputs; a plurality of input terminals for receiving a plurality of inputs and being interconnected with the amplifier inputs through a plurality of input impedances, respectively, and a feedback network including a plurality of summing circuits for combining the plurality of amplifier outputs in a plurality of different sets of groups each group numbering one fewer than the plurality, respectively, and feeding back the sum of each group of amplifier outputs to the remaining amplifier input for maintaining the difference between any group of amplifier outputs proportional to the difference of a corresponding group of inputs at the terminals and maintaining the average value of the amplifier outputs constant and unrelated to the inputs at the terminal. Also disclosed is a multi-fferential amplifier including a plurality of differential input/output circuits responsive to a plurality of input signals and providing a plurality of output signals; each input signal is shared between a different set of differential input/output circuits in a plurality of different sets of groups, each group numbering one fewer than the plurality; each differential input/output circuit receives one input signal at its positive input and the other input signal at its negative input.

47 Claims, 10 Drawing Sheets

TRIFFERENTIAL AMPLIFIER AND TRIFFERENTIAL AMPLIFIER SYSTEM

FIELD OF THE INVENTION

This invention relates to a trifferential amplifier and trifferential amplifier system and more generally to such an N-fferential or multi-fferential amplifier and system for a plurality of three or more inputs and outputs.

BACKGROUND OF THE INVENTION

Operational amplifiers and differential amplifiers have been available in the marketplace for a long time. In a typical application an operational amplifier accepts an input voltage referred to a node typically known as ground, and generates an output voltage referred to the same node. On the other hand, a differential amplifier accepts the difference between two voltages at its inputs and produces two output voltages whose difference is proportional to the difference of the input voltages. Ideally, a differential amplifier does not respond to the average value of the two voltages present at its inputs (also known as input common-mode voltage).

Recently, applications have emerged in the marketplace which require that three input voltages be processed to produce three output voltages such that:

1. the voltage difference between any pair of output voltages is proportional to the difference between the corresponding pair of input voltages through the same proportionality constant,
2. the average value of the three output voltages is constant and unrelated to the input voltages.

One approach would be to just use three single-ended amplifiers, but this would not maintain the output common-mode voltage constant and unrelated to the input common-mode voltage.

BRIEF SUMMARY OF THE INVENTION

It is therefore an object of this invention to provide a trifferential amplifier and amplifier system.

It is a further object of this invention to provide such a trifferential amplifier and amplifier system which have the beneficial attributes of a differential amplifier and amplifier system.

It is a further object of this invention to provide such a trifferential amplifier and amplifier system in which the voltage difference between any pair of outputs is proportional to the difference between the corresponding pair of inputs through the same proportionality constant.

It is a further object of this invention to provide such a trifferential amplifier and amplifier system in which the average value of the outputs is constant and unrelated to the inputs.

It is a further object of this invention to provide such a trifferential amplifier and amplifier system which are adaptable for handling a plurality of three or more inputs and outputs as in a multi-fferential or N-fferential amplifier and amplifier system.

It is a further object of this invention to provide such a trifferential amplifier and amplifier system which reject common mode inputs.

It is a further object of this invention to provide such a trifferential amplifier and amplifier system which are compact, simple, fast and use fewer components.

It is a further object of this invention to provide such a trifferential amplifier and amplifier system which require lower power, less chip area, with higher precision and which avoid the need for additional inverters.

The invention results from the realization that an improved "differential" amplifier and amplifier system referred to herein as a trifferential or N-fferential or multi-fferential amplifier and amplifier system for receiving a plurality, e.g. three or more inputs and providing three or more outputs which have the benefits of a conventional differential amplifier and amplifier system can be achieved with an amplifier having a plurality of amplifier inputs and a plurality of amplifier outputs; a plurality of input terminals for receiving a plurality of inputs and being interconnected with the amplifier inputs through a plurality of input impedances, respectively; and a feedback network including a plurality of summing circuits for combining the a plurality of amplifier outputs in a plurality of different sets of groups, each set numbering one fewer than the plurality, respectively, and feeding back the sum of each set of amplifier outputs to the remaining amplifier input for maintaining the difference between any pair of amplifier outputs proportional to the voltage difference of a corresponding pair of input voltages at the terminals and maintaining the average value of the amplifier outputs constant and unrelated to the inputs of the terminal wherein the trifferential amplifier or multi-fferential amplifier or N-fferential amplifier employs three or more differential input/output circuits responsive to three or more inputs and provides three or more outputs with each input being between different groups of the differential input/output circuits; each differential input/output circuit receives inputs at its positive and negative inputs.

The subject invention, however, in other embodiments, need not achieve all these objectives and the claims hereof should not be limited to structures or methods capable of achieving these objectives.

This invention features a trifferential amplifier system including an amplifier having three amplifier inputs and three amplifier outputs. There are three voltage input terminals for receiving three input voltages and being interconnected with the amplifier inputs through three input impedances, respectively. A feedback network includes three summing circuits for combining the three amplifier voltage outputs in three different sets of pairs, respectively, and feeding back the sum of each pair of amplifier voltage outputs to the remaining amplifier input for maintaining the voltage difference between any pair of amplifier voltage outputs proportional to the voltage difference of a corresponding pair of input voltages at the terminals and maintaining the average value of the amplifier voltage outputs constant and unrelated to the input voltages at the terminal.

In a preferred embodiment the summing circuits may each include a summing junction connected to an amplifier input. The summing circuits may each include a pair of feedback impedances connected from the junction to each of the other amplifier voltage outputs. The impedances within each pair of impedances may be equal. The amplifier may include three differential input/output circuits responsive to three input signals and providing three output signals. Each input signal may be shared between a different pair of the differential input/output circuits. Each different input/output circuit may receive one input signal at its positive input, the other input signal at its negative input. The three output signals may be derived from opposite polarity outputs of different pairs of input/output circuits. The amplifier inputs may be currents. Each differential input/output circuit may include a differential pair. Each differential pair may include a separate current source or they may include the same source. Each different input/output circuit may include a voltage amplifier having a differential input, a differential output, and each differential output may include a series impedance.

The invention also features a multi-fferential amplifier system including an amplifier having a plurality of amplifier inputs and a plurality of amplifier outputs. There are plurality of voltage input terminals for receiving a plurality of input voltages and being interconnected with the amplifier inputs through a plurality of input impedances, respectively. A feedback network includes a plurality of summing circuits for combining the plurality of amplifier voltage outputs in a plurality of different sets, each set numbering one fewer than the plurality, and feeding back the sum of each set of amplifier voltage outputs to the remaining amplifier input for maintaining the voltage difference between any set of amplifier voltage outputs proportional to the voltage difference of a corresponding set of input voltages at the terminals and maintaining the average value of the amplifier voltage outputs constant and unrelated to the input voltages at the terminal.

In a preferred embodiment the summing circuits may each include a summing junction connected to an amplifier input. The summing circuits may include a summing junction connected to a set of feedback impedances connected from the junction to each of the other amplifier voltage outputs. The impedances within each set of impedances may be equal. The amplifier may include a plurality of different input/output circuits responsive to a plurality of input signals and providing a plurality of output signals. The output signals may be derived from opposite polarity outputs of the input/output circuits. The amplifier inputs may be currents. Each differential input/output circuit may include a differential pair. Each differential pair may include a separate current source or they may share the same current source. Each differential input/output circuit may include a voltage amplifier having a differential input, a differential output, and each differential output may include a series impedance.

This invention also features a trifferential amplifier system including an amplifier having three amplifier inputs and three amplifier outputs and three input terminals for receiving three inputs and being interconnected with the amplifier inputs through three input impedances respectively. A feedback network includes three summing circuits for combining the three amplifier outputs in three different sets of pairs, respectively, and feeds back the sum of each pair of amplifier outputs to the remaining amplifier input for maintaining the difference between any pair of amplifier outputs proportional to the difference of a corresponding pair of inputs at the terminals and maintaining the average value of the amplifier outputs constant and unrelated to the inputs at the terminal.

In a preferred embodiment the summing circuits may each include a summing junction connected to an amplifier input. The summing circuits may each include a pair of feedback impedances connected from the junction to each of the other amplifier outputs. The impedances within each pair of impedances may be equal. The amplifier may include three different input/output circuits responsive to three input signals and providing three output signals. Each input signal may be shared between a different pair of differential input/output circuits. Each differential input/output circuit may receive one input signal at its positive input and the other input signal at its negative input. The three output signals may be derived from opposite polarity outputs of different pairs of input/output circuits. The amplifier inputs may be currents. The differential input/output circuit may include a differential pair. The differential pair may include a separate current source or they may share a current source. Each differential input/output circuit may include a voltage amplifier having a differential input, a differential output, and each differential output may include a series impedance.

This invention also features a multi-fferential amplifier system including an amplifier having a plurality of amplifier inputs and a plurality of amplifier outputs. There are plurality of input terminals for receiving a plurality of inputs and being interconnected with the amplifier inputs through a plurality of input impedances, respectively. A feedback network includes a plurality of summing circuits for combining a plurality of amplifier outputs in a plurality of different sets of groups, each group numbering one fewer than the plurality, respectively, and feeding back the sum of each group of amplifier outputs to the remaining amplifier input for maintaining the difference between any group of amplifier outputs proportional to the difference of a corresponding group of inputs at the terminals and maintaining the average value of the amplifier outputs constant and unrelated to the inputs at the terminal.

This invention also features a trifferential amplifier including three differential input/output circuits responsive to three input signals and providing three output signals; each input signal being shared between a different pair of the differential input/output circuits; each differential input/output circuit receiving one input signal at its positive input and the other input signal at its negative input.

In the preferred embodiment the three output signals may be derived from opposite plurality outputs of different pairs of input/output circuits; each differential input/output circuit may include a differential pair; each differential pair may include a separate current source or they may share the same current source. Each differential input/output circuit may include a voltage amplifier having a differential input, a differential output and each differential output may include a series impedance.

This invention also features a multi-fferential amplifier including a plurality of differential input/output circuits responsive to a plurality of input signals and providing a plurality of output signals. Each input signal is shared between a different set of the differential input/output circuits. There are a plurality of different sets of groups each group numbering one less than the plurality. Each differential input/output circuit receives one input signal at its positive input and the other input signal at its negative input.

In the preferred embodiment the plurality of output signals may be derived from opposite plurality outputs of different pairs of input/output circuits. The amplifier inputs may be currents. Each differential input/output circuit may include a differential pair. Each differential pair may include a separate current source or they may share the same current source. Each differential input/output circuit may include a voltage amplifier having a differential input, a differential output and each differential output may include a series impedance.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
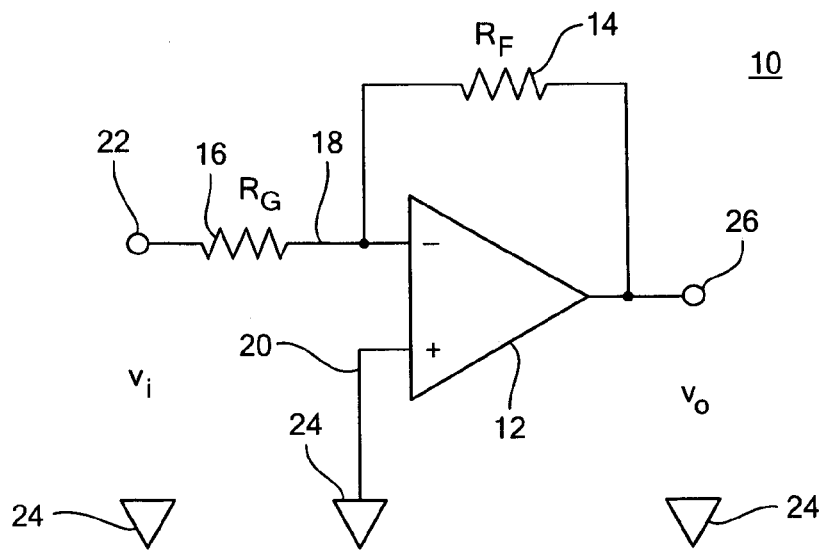
FIG. 1 is a schematic diagram of a prior art single-ended inverting amplifier.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 an operational amplifier operating as single ended inverting amplifier 10 which includes an amplifier 12, feed back resistance $R_F$ 14 and gain resistance $R_G$ 16. Amplifier 12 receives the input signal at its inverting input 18 and has its positive input 20 connected to ground. The input voltage $v_i$ is applied across input terminal 22 and ground 24. The output voltage $v_o$ appears at terminal 26. The output voltage $v_o$ referred to ground is proportional to the input voltage $v_i$ also referred to ground with proportionality constant k equal to $-R_F/R_G$. As the voltage at the inverting input rises in response to an increase in input voltage $v_i$, the output voltage $v_o$ falls and conversely, therefore establishing a negative feedback path through feedback resistance $R_F$ 14.

Figure 2:
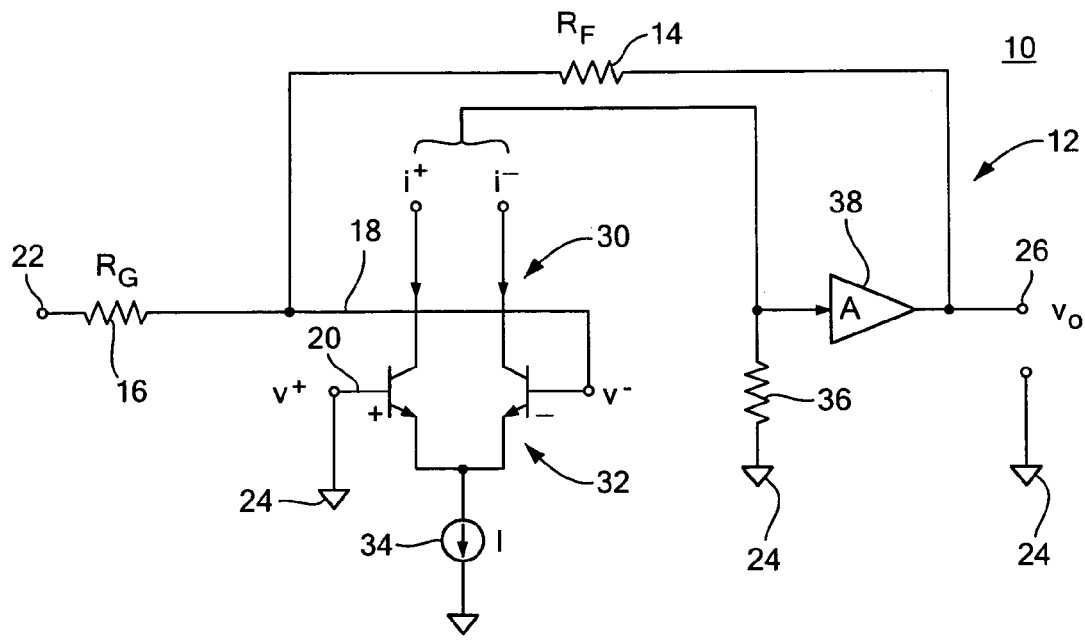
FIG. 2 is a more detailed schematic diagram of the prior art single-ended inverting amplifier of FIG. 1.

Typically, operational amplifier 10, FIG. 1, is implemented as shown in FIG. 2 with a differential circuit 30 including differential pair 32 and current source 34. The current output of differential circuit 30 is applied to resistance 36 to produce a voltage input to amplifier 38 which in turn provides the output $v_o$ at output terminal 26.

Figure 3:
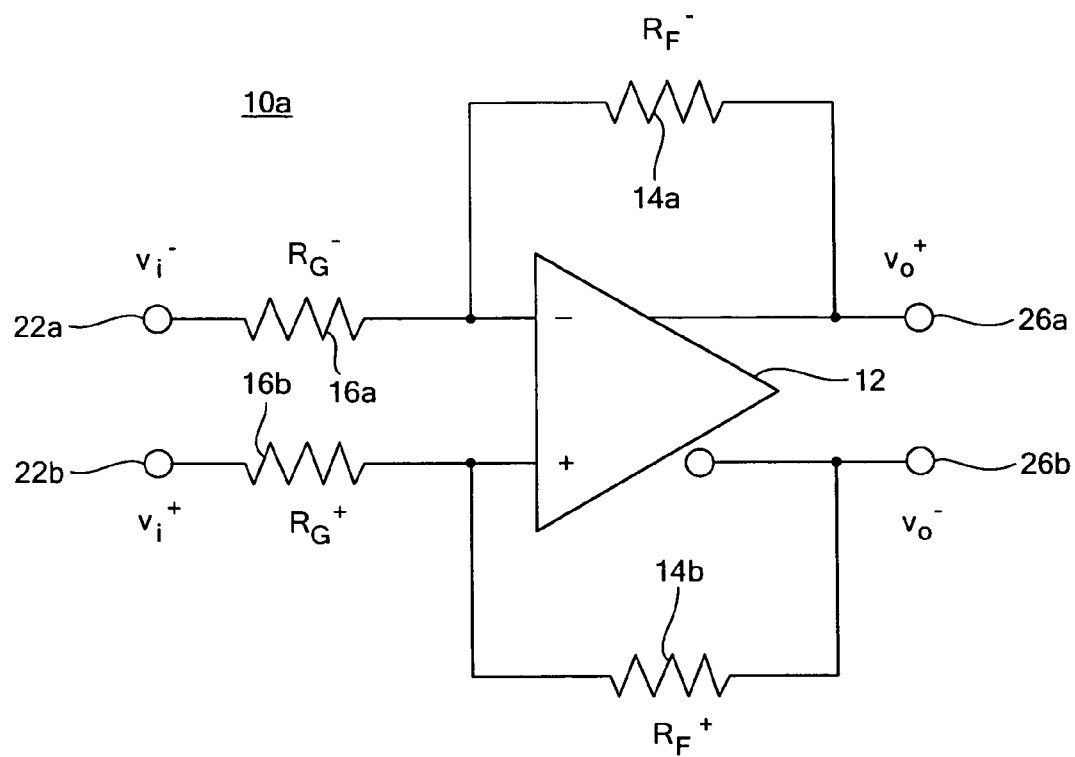
FIG. 3 is schematic diagram of a prior art differential amplifier.

Differential amplification is shown in FIG. 3. Here the differential input is defined as the algebraic difference of the input voltages, or $v_i = v_i^+ - v_i^-$. Similarly the differential output is defined as the algebraic difference of the two output voltages or $v_o = v_o^+ - v_o^-$. Since the output voltage is available both in its true ($v_o^+$) and complement ($v_o^-$) form, each feedback resistance $R_F$ provides a negative feedback path. As the voltage of the non-inverting input rises in response to an increase an input voltage $v_i^+$, the output $v_o^-$ falls, and conversely, therefore establishing a negative feedback path through the resistance $R_F$ 14b.

Figure 4:
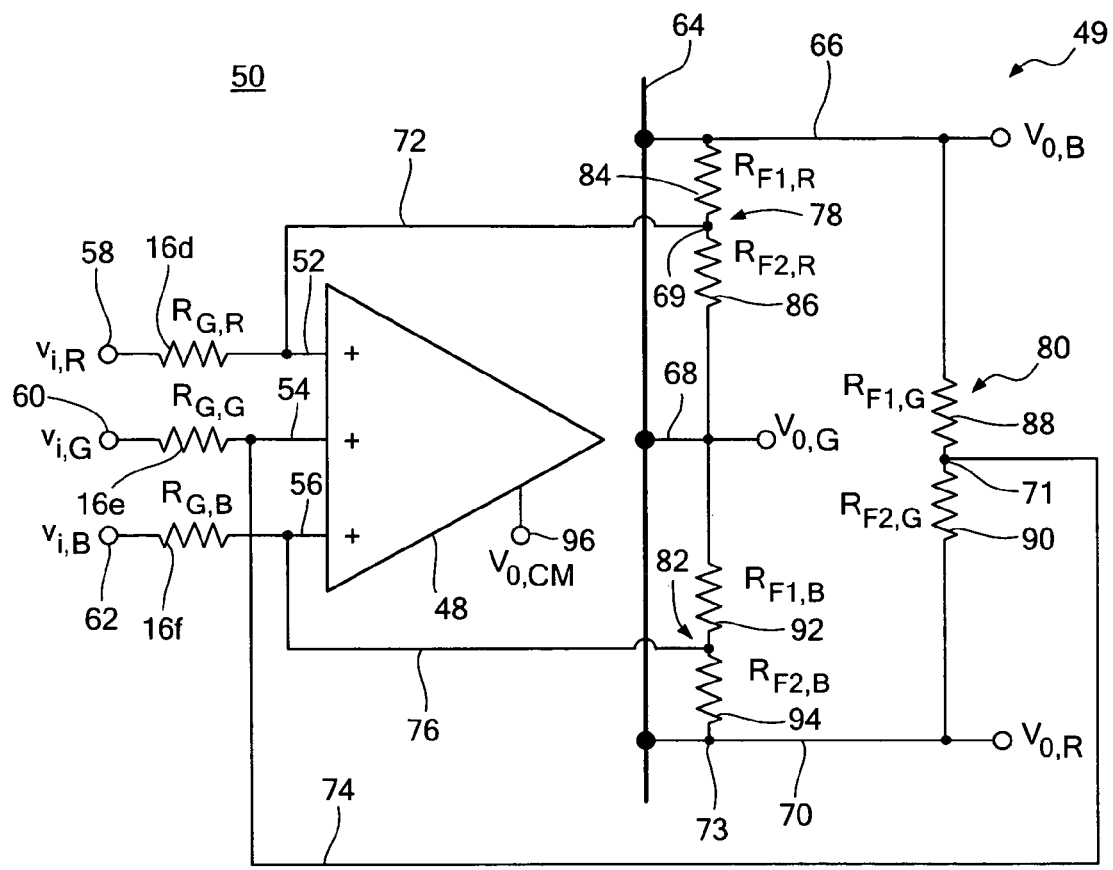
FIG. 4 is schematic diagram of a trifferential amplifier and amplifier system according to this invention.

A trifferential amplifier system 50 according to this invention is shown in, FIG. 4, where it is symbolized by a triangle and a vertical bar facing the triangle on the right. Trifferential amplifier system 50 includes trifferential amplifier 48, gain resistances $R_{GR}$, 16d; $R_{GG}$, 16e; $R_{GB}$ 16f; and feedback network 49. Trifferential amplifier 48 receives three input signals at its inputs 52, 54, and 56. The input signals $v_{iR}$, $v_{iG}$ $v_{iB}$ appear at input terminals 58, 60, and 62 and are delivered to inputs 52, 54, and 56 through gain resistances $R_{GR}$ 16d; $R_{GG}$ 16e; $R_{GB}$ 16f. The subscript nomenclature here of R, G, and B represents the colors red, green, and blue indicating an application in processing red, green, and blue video signals, but this is not a necessary limitation of the invention. The plus signs at each of the inputs 52, 54, 56 signify that the voltage gain from each input to its corresponding output is positive. The outputs depart from the symbolic vertical bar 64 at 66, $v_{oB}$; 68, $v_{oG}$; and 70, $v_{oR}$. Thus there are three inputs and three outputs associated with each output. Feedback network 49 includes three feedback paths 72, 74, 76 associated with inputs 52, 54, and 56 respectively. Each feedback circuit 72, 74, 76 has associated with it a summing circuit 78, 80, 82, respectively. Summing circuit 78 includes two feedback resistances 84, 86 which combine the blue output 66 and the green output 68 at junction 69 and feed it back to the red output 52. Summing circuit 80 includes feedback resistances 88 and 90 which combine the blue output 66 and red output 70 at junction 71 and feed it back to the green input 54. Summing circuit 82 includes feedback resistances 92 and 94 which combine green output 68 and red output 70 at junction 73 and feed it back to the blue output 56. Thus there are three inputs and three outputs. The sets of summing circuits also number three but the group of impedances in each summing circuit number one less, or two. Simply stated, when the number of inputs and outputs is N the number of summing circuits is also N but the number of impedance groups in each summing circuit is N-1. Also in trifferential amplifier 48 the output $v_o$, CM 96 is present; its purpose is to set the average value of all three outputs. All of the resistances 84-94 may be of equal value as may resistances 16d, 16e 16f.

Figure 5:
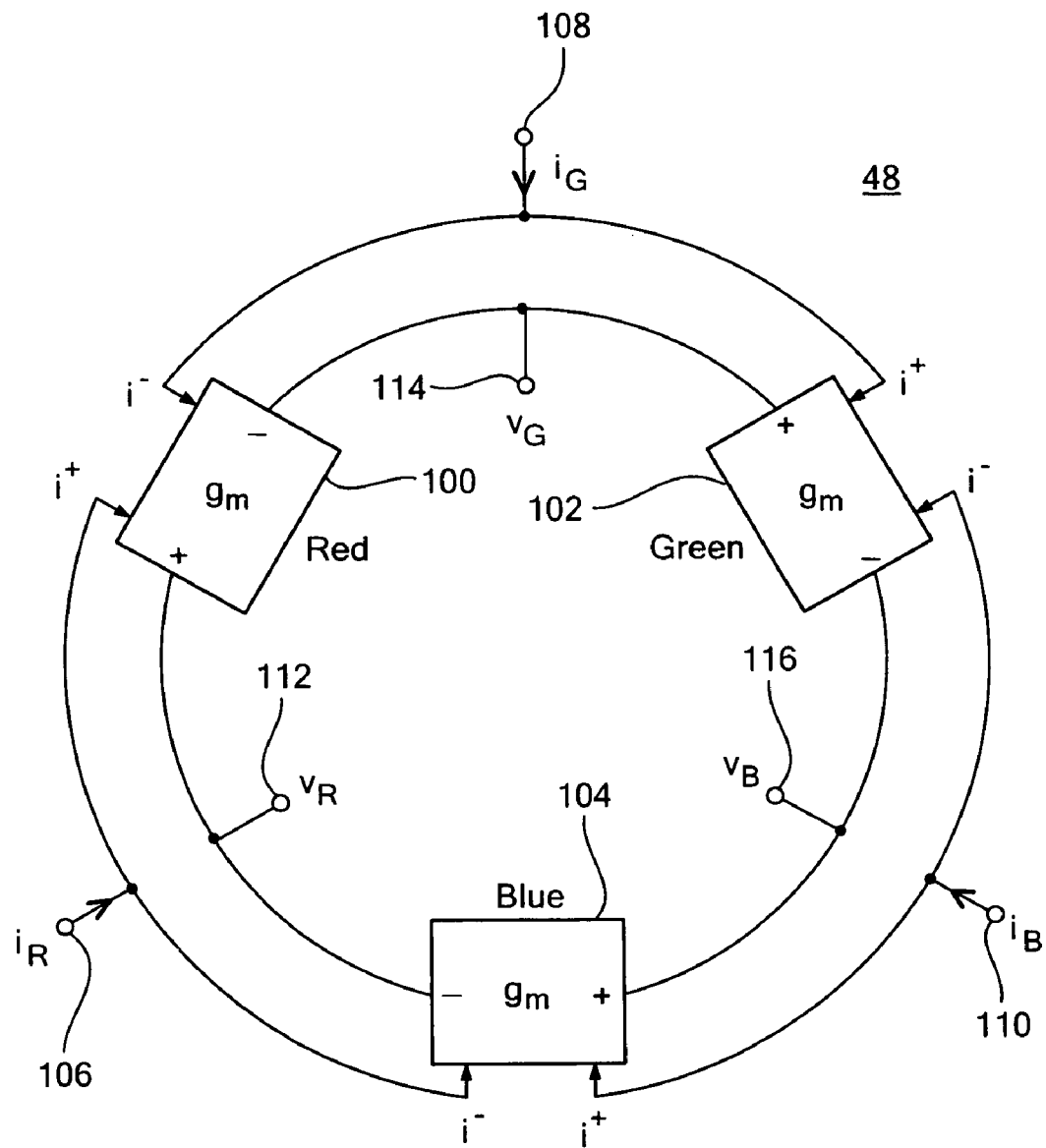
FIG. 5 is a more detailed block diagram of the trifferential amplifier of FIG. 4.

Trifferential amplifier 48, FIG. 5, includes three trifferential input/output differential transconductance amplifiers 100, 102, 104. There are three outputs $i_R$ 106; $i_G$ 108; $i_B$ 110 and three inputs $v_R$, 112; $v_G$, 114; and $v_B$, 116. Each output, shown as currents here, is shared with the pair of differential input/output circuits providing the positive input to one of those circuits and the negative input to the other. Likewise each output is derived from a pair of the differential input/output circuits coming from the positive output of one and the negative output of the other. Differential input/output circuits 100, 102, 104, FIG. 6, may be comprised of differential pairs 118, 120, 122 coupled with current sources 124, 126 and 128. Each differential pair 118, 120, 122 includes a pair of transistors whose bases and collectors are connected with those of the other differential input/output circuits while the emitters are separately connected to their own current sources 124, 126, 128. If, as well, their emitters are connected together, FIG. 7, so they share a single current source 130, adjacent halves of differential input/output circuits each may be collapsed pair-wise into transistors 118', 120' and 122', respectively, with typically an increase or doubling in area and current rating. One shortcoming of this implementation is that the output can only be taken at the given polarity whereas with the implementation of FIG. 6, the output voltage can be taken with either polarity.

Figure 6:
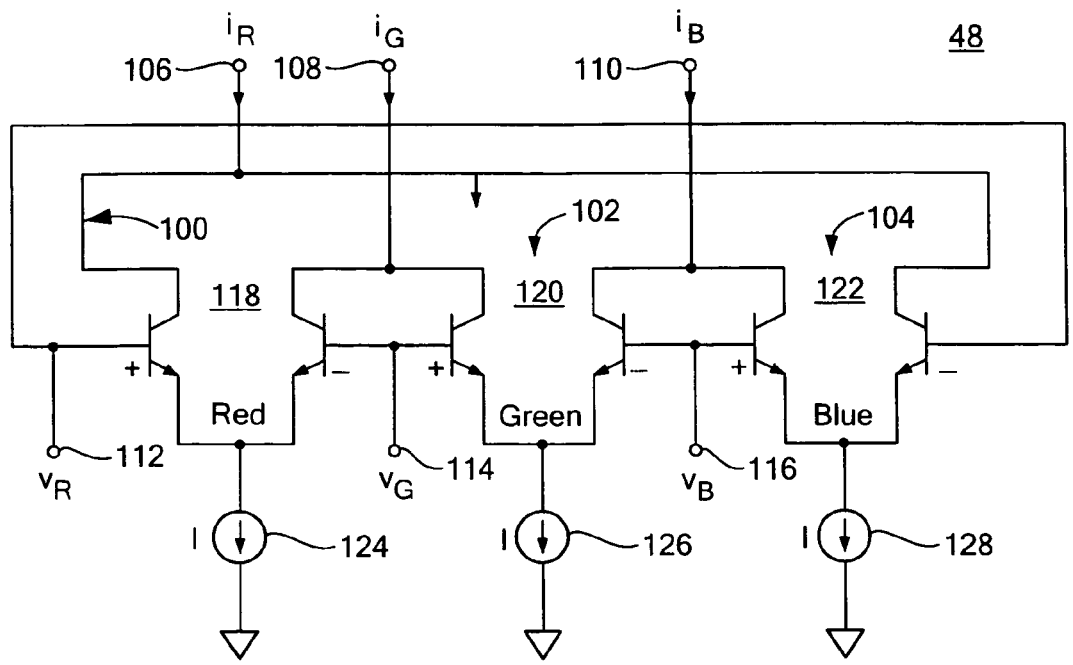
FIG. 6 is a still more detailed block diagram of the trifferential amplifier including trifferentially connected voltage-in current-out differential pairs similar to that of FIG. 2.
Figure 7:
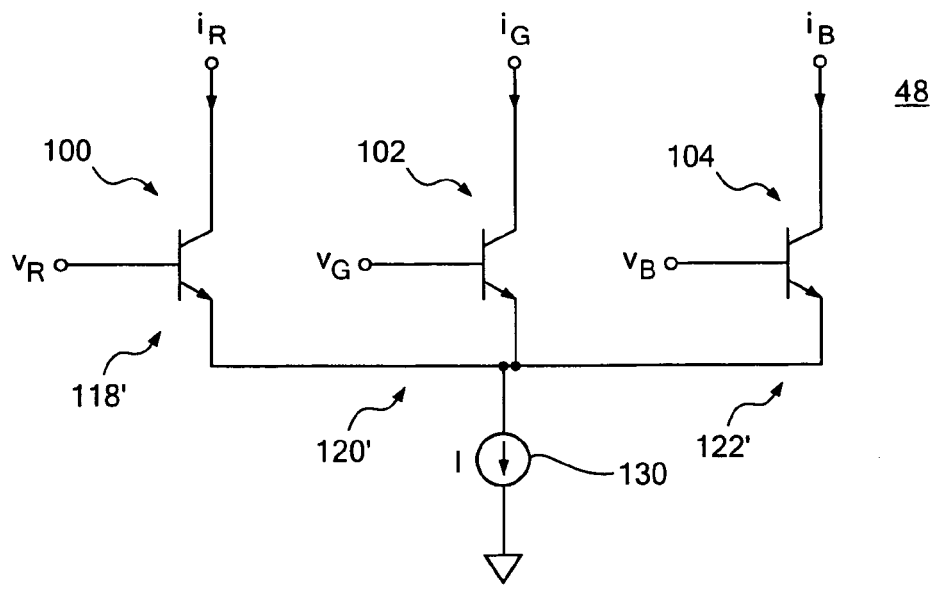
FIG. 7 is a view similar to FIG. 6 of the trifferentially connected differential pairs illustrating trifferential operation.
Figure 8:
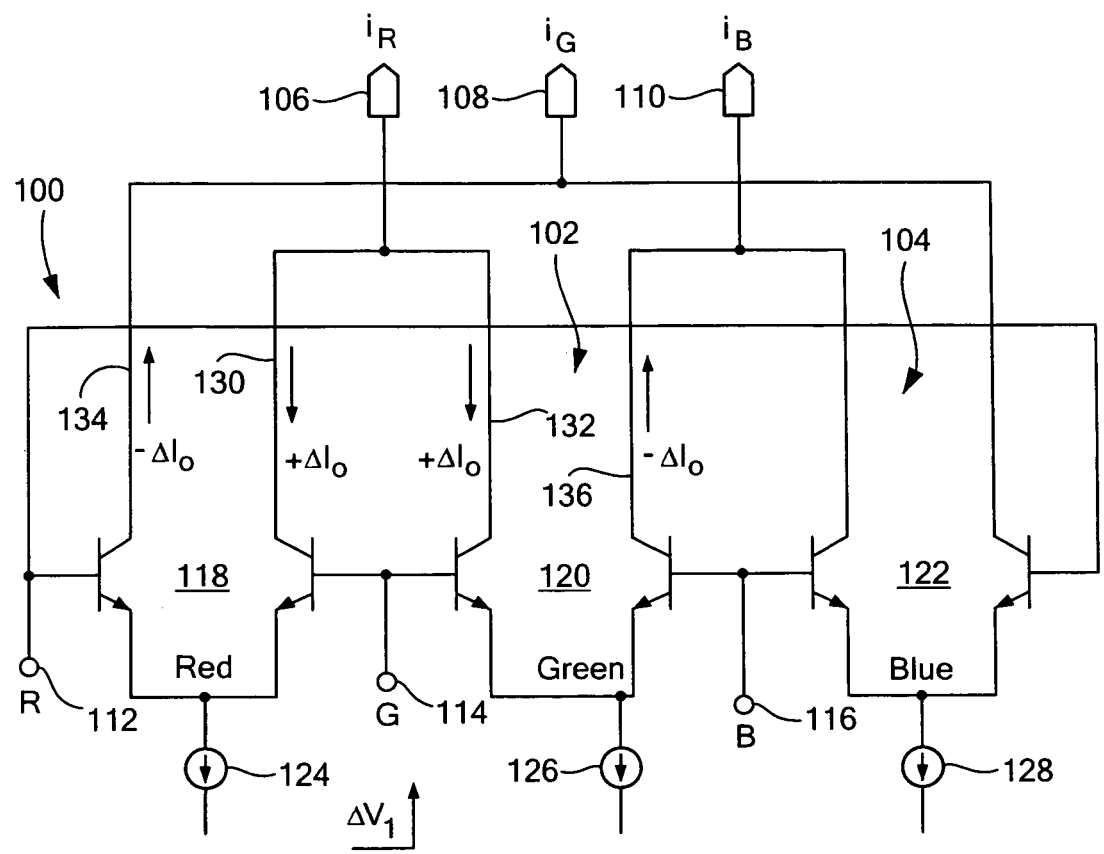
FIG. 8 is a view similar to FIG. 6 of a simplified embodiment of trifferentially connected differential pairs.

The operation of FIG. 6 is shown in FIG. 8, where if the voltage delta $v_i$ at 114 increases the currents in both legs 130 and 132 will each increase. Balancing this, the currents in legs 134 and 136 will decrease so the overall response is for differences of pairs of output currents to be proportional to the corresponding differences of input voltages, and for the total output current to remain constant.

Figure 9:
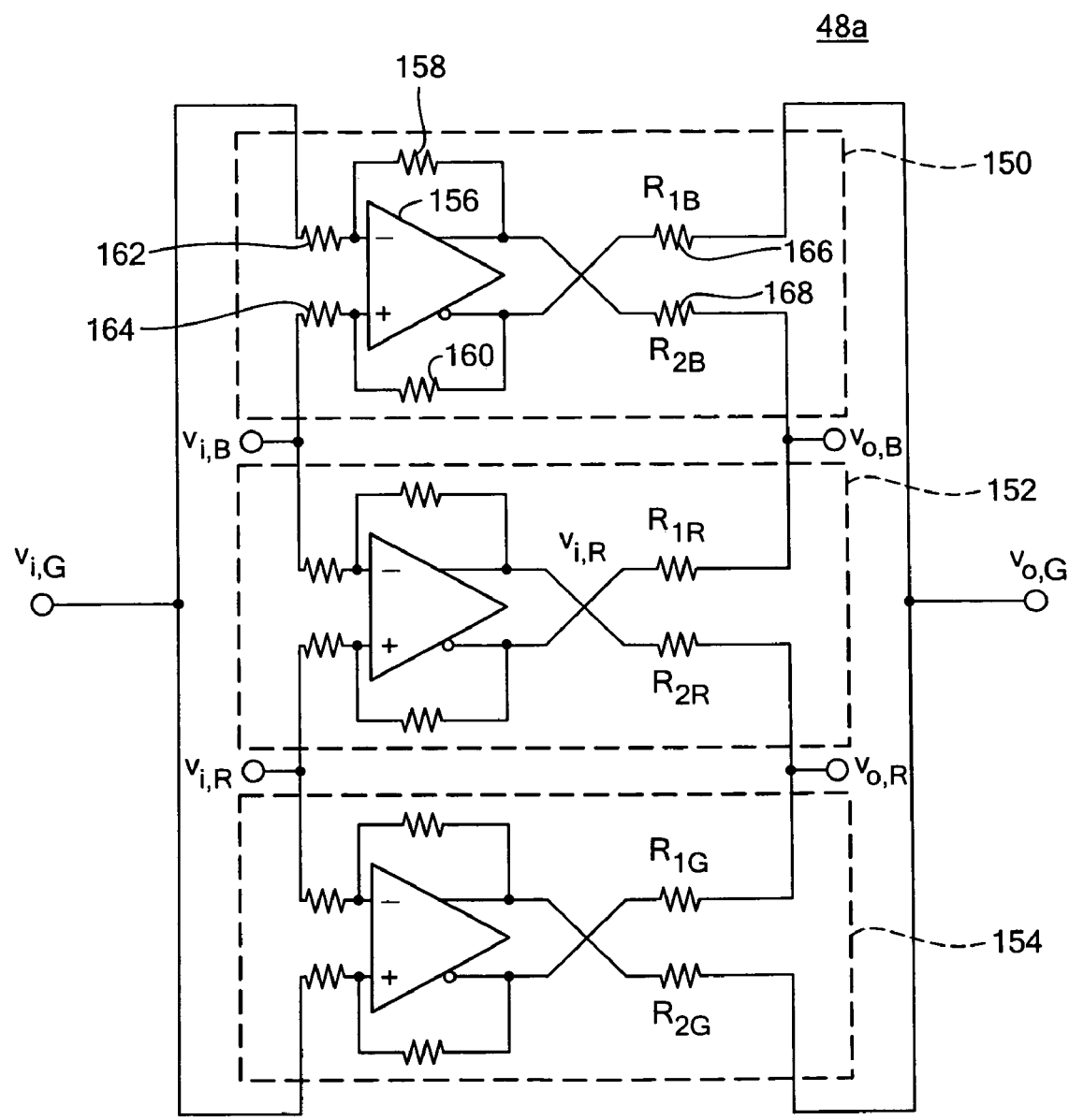
FIG. 9 is a schematic diagram of a trifferential amplifier with trifferentially connected voltage in-voltage out differential pairs.

Although, thus far the trifferential amplifier in FIGS. 4-8 have been implemented with a voltage-in, current-out arrangement, this is not a limitation of the invention. For as shown in FIG. 9, a trifferential input/output circuit 48a having both voltage-in and voltage-out can be constructed in accordance with this invention which includes voltage amplifiers 150, 152, 154 having voltage inputs $v_{iG}$, $v_{iB}$ $v_{iR}$ and voltage outputs $v_{oG}$, $v_{oB}$ $v_{oR}$. Each voltage amplifier, as illustrated with respect to amplifier 150, may include a differential amplifier similar to that shown in FIG. 3. There is an amplifier 156 with feedback impedances 158 and 160 coupled to gain impedances 162 and 164. There are also output impedances 166 and 168.

Although thus far the particular embodiment of the invention disclosed is a trifferential amplifier, that is, one having three inputs and three outputs, this is a practical illustration only as the invention has important applications in the color video environment. However, the invention applies to an N-fferential or multi-fferential amplifier system and amplifier. For example, the quad-fferential amplifier 200, FIG. 10, includes six differential input-output circuits 202, 204, 206, 208, 210, and 212. There are four inputs 214, 216, 218, 220 and four outputs 222, 224, 226, and 228. Circuits 202, 204, 206, and 208 are connected in a loop similar to that shown in FIG. 5, while circuits 210 and 212 are cross-connected from input corners, circuit 210 between inputs 216 and 220, circuit 212 between inputs 214 and 218. Each input is provided to three circuits now instead of two as in FIG. 5 and each output is derived from three circuits. Once again with a plurality or N inputs and N outputs, there are N sets of connections but within each set there is N−1 actual group connections. When the voltage on input 214 increases by plus Δv the three circuits 208, 212, and 202 attached to it sense this voltage producing three pairs of currents. Three of these currents are positive, while the other three are negative. The three positive currents are all collected at output 222, while each of the remaining negative currents is collected by each of the remaining outputs 224, 226, and 228 so that the overall average output current is constant.

Figure 10:
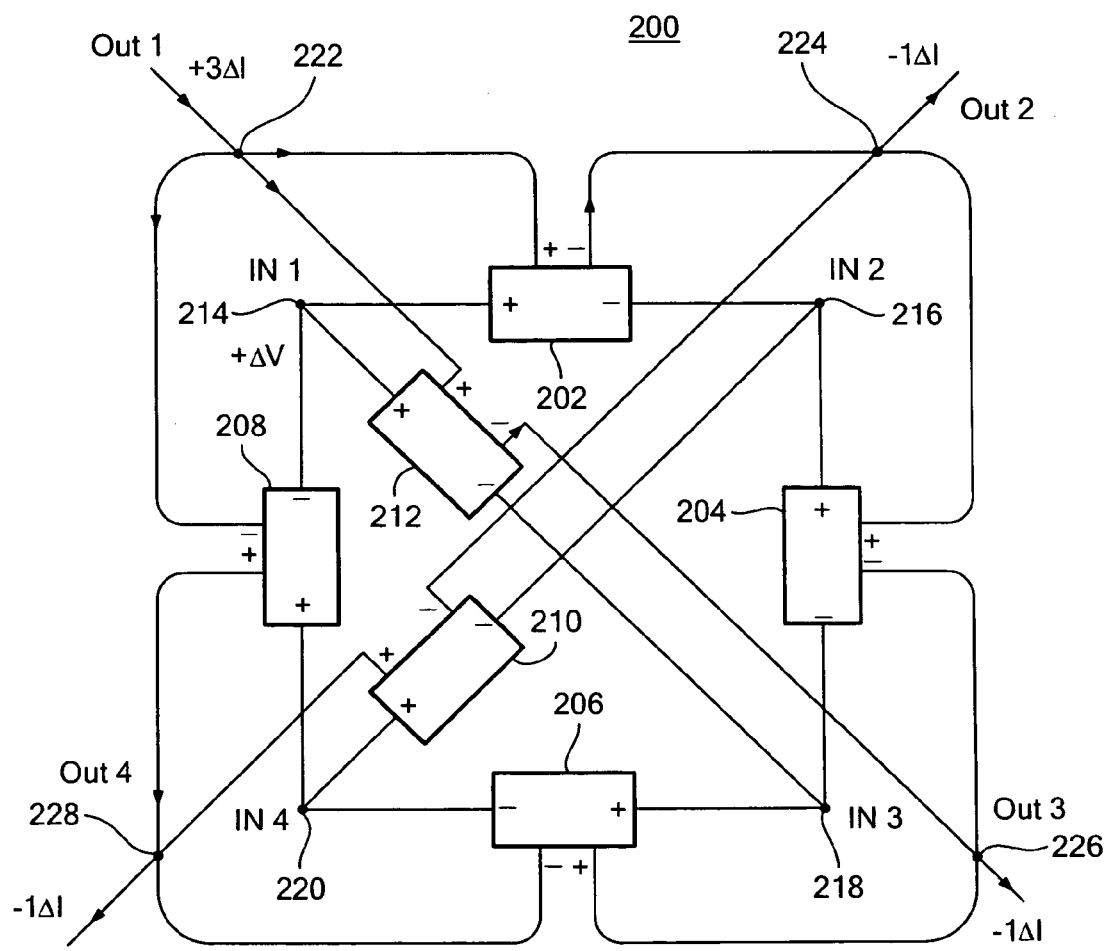
FIG. 10 is a view similar to FIG. 5 of a multi-fferential (N-fferential) amplifier with more than three inputs and outputs.
Figure 11A:
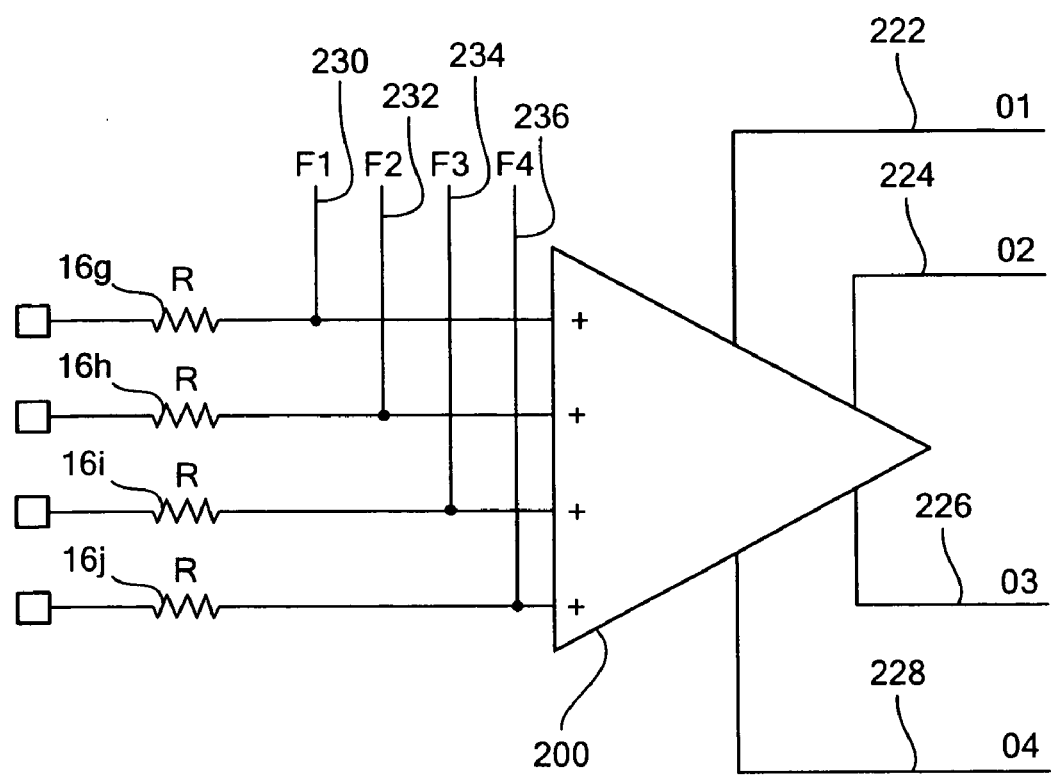
FIG. 11A and FIG. 11B are views similar to FIG. 4 of a multi-fferential (N-fferential) amplifier system with more than three inputs and outputs.
Figure 11B:
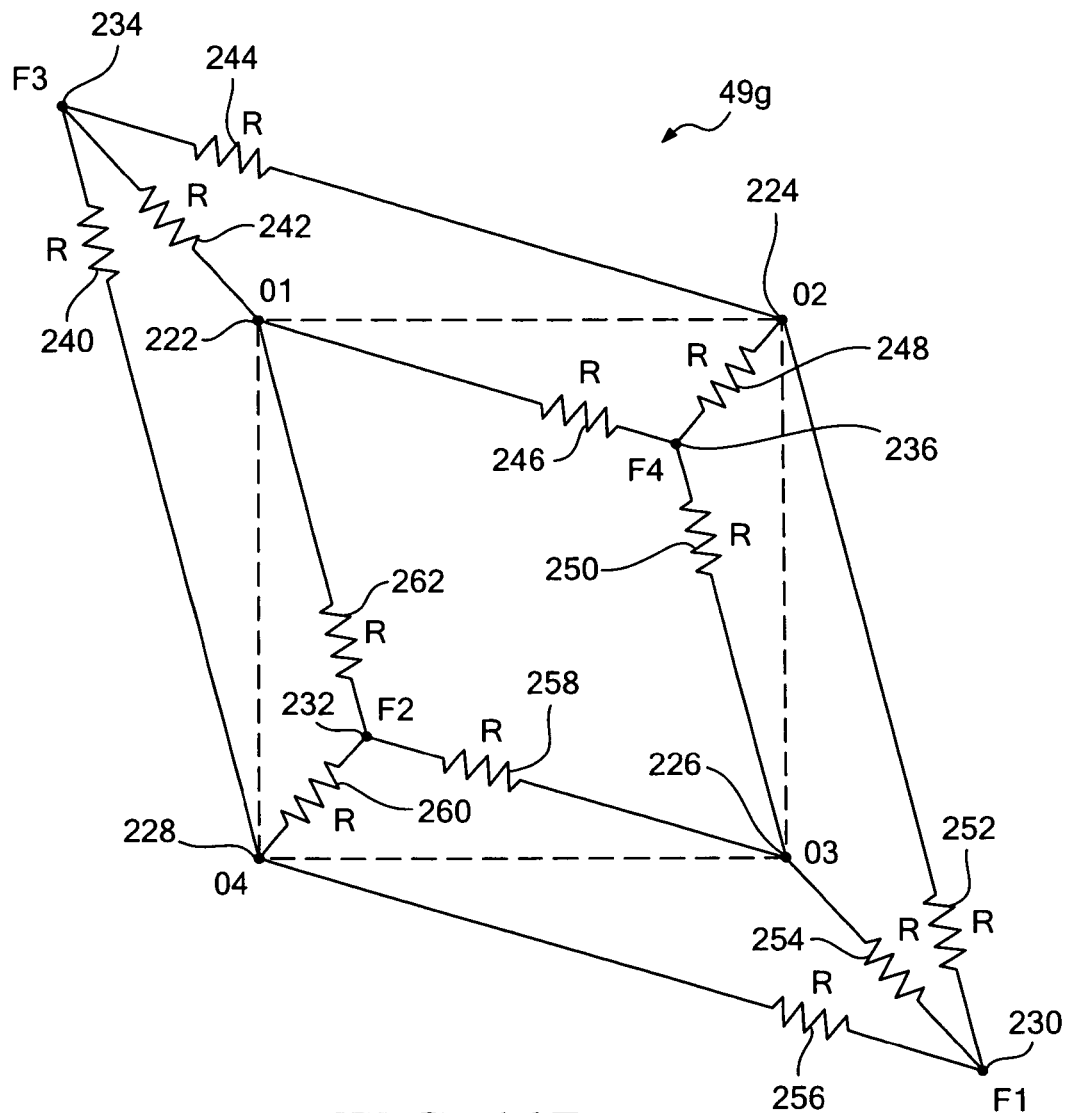

A quad-fferential amplifier system is shown in FIGS. 11A and 11B, using the quad fferential amplifier of FIG. 10. Quad-fferential amplifier 200, FIG. 11A, is shown having four gain resistances 16g, 16h, 16i, 16j, at its input as well as four feedback inputs 230, 232, 234, and 236. Feedback impedance network 49g, FIG. 11B, includes 12 feedback impedances, resistances 240, 242, 244, 246, 248, 250, 252, 254, 256, 258, 260, 262, all of which may be equal as is the case with gain resistors 16g-16j. The connections between amplifier 200, outputs 222-228 and feedback inputs 230-236 are shown correspondingly on feedback impedance network 49g, FIG. 11B.

Although specific features of the invention are shown in some drawings and not in others, this is for convenience only as each feature may be combined with any or all of the other features in accordance with the invention. The words "including", "comprising ", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A trifferential amplifier system comprising:
    an amplifier having three amplifier inputs and three amplifier outputs;
    three voltage input terminals for receiving three input voltages and being interconnected with said amplifier inputs through three input impedances, respectively; and
    a feedback network including three summing circuits for combining said three amplifier voltage outputs in three different sets of pairs, respectively, and feeding back the sum of each pair of amplifier voltage outputs to the remaining amplifier input for maintaining the voltage difference between any pair of amplifier voltage outputs proportional to the voltage difference of a corresponding pair of input voltages at said terminals and maintaining the average value of the amplifier voltage outputs constant and unrelated to the input voltages at said terminal.

2. The trifferential amplifier system of claim 1 in which each said summing circuit includes a summing junction connected to an amplifier input.

3. The trifferential amplifier system of claim 2 in which each said summing circuit includes a pair of feedback impedances connected from said junction to each of the other amplifier voltage outputs.

4. The trifferential amplifier system of claim 3 in which the impedances within each pair of impedances are equal.

5. The trifferential amplifier system of claim 1 in which said amplifier includes three differential input/output circuits responsive to three input signals and providing three output signals, each input signal being shared between a different pair of said differential input/output circuits, each differential input/output circuit receiving one input signal at its positive input and the other input signal at its negative input.

6. The trifferential amplifier system of claim 5 in which said three output signals are derived from opposite polarity outputs of different pairs of input/output circuits.

7. The trifferential amplifier system of claim 1 in which said amplifier inputs are currents.

8. The trifferential amplifier system of claim 5 in which each said differential input/output circuit includes a differential pair.

9. The trifferential amplifier system of claim 8 in which each said differential pair includes a separate current source.

10. The trifferential amplifier system of claim 8 in which each said differential pair includes the same current source.

11. The trifferential amplifier system of claim 5 in which each said differential input/output circuit includes a voltage amplifier having a differential input, a differential output and each differential output includes a series impedance.

12. A multi-fferential amplifier system comprising:
    an amplifier having a plurality of amplifier inputs and a plurality of amplifier outputs;
    a plurality of voltage input terminals for receiving a plurality of input voltages and being interconnected with said amplifier inputs through a plurality of input impedances, respectively; and
    a feedback network including a plurality of summing circuits for combining a plurality of amplifier voltage outputs in a plurality of different sets of groups each set numbering one fewer than said plurality, respectively, and feeding back the sum of each set of amplifier voltage outputs to the remaining amplifier input for maintaining the voltage difference between any set of amplifier voltage outputs proportional to the voltage difference of a corresponding set of input voltages at said terminals and maintaining the average value of the amplifier voltage outputs constant and unrelated to the input voltages at said terminal.

13. The multi-fferential amplifier system of claim 12 in which each said summing circuit includes a summing junction connected to an amplifier input.

14. The multi-fferential amplifier system of claim 13 in which each said summing circuit includes a set of feedback impedances connected from said junction to each of the other amplifier voltage outputs.

15. The trifferential amplifier system of claim 14 in which said impedances within each set of impedances are equal.

16. The trifferential amplifier system of claim 12 in which said amplifier includes a plurality of differential input/output circuits responsive to a plurality of input signals and providing a plurality of output signals.

17. The trifferential amplifier system of claim 16 in which said output signals are derived from opposite polarity outputs of said input/output circuits.

18. The trifferential amplifier system of claim 12 in which said amplifier inputs are currents.

19. The trifferential amplifier system of claim 16 in which each said differential input/output circuit includes a differential pair.

20. The trifferential amplifier system of claim 19 in which each said differential pair includes a separate current source.

21. The trifferential amplifier system of claim 19 in which each said differential pair includes the same current source.

22. The trifferential amplifier system of claim 16 in which each said differential input/output circuit includes a voltage amplifier having a differential input and a differential output and each differential output includes a series impedance.

23. A trifferential amplifier system comprising:
an amplifier having three amplifier inputs and three amplifier outputs;
three input terminals for receiving three inputs and being interconnected with said amplifier inputs through three input impedances, respectively; and
a feedback network including three summing circuits for combining the three amplifier outputs in three different sets of pairs, respectively, and feeding back the sum of each pair of amplifier outputs to the remaining amplifier input for maintaining the difference between any pair of amplifier outputs proportional to the difference of a corresponding pair of inputs at said terminals and maintaining the average value of the amplifier outputs constant and unrelated to the inputs at said terminal.

24. The trifferential amplifier system of claim 23 in which each said summing circuit includes a summing junction connected to an amplifier input.

25. The trifferential amplifier system of claim 24 in which each said summing circuit includes a pair of feedback impedances connected from said junction to each of the other amplifier outputs.

26. The trifferential amplifier system of claim 25 in which said impedances within each pair of impedances are equal.

27. The trifferential amplifier system of claim 23 in which said amplifier includes three differential input/output circuits responsive to three input signals, and providing three output signals, each input signal being shared between a different pair of said differential input/output circuits, each said differential input/output circuit receiving one input signal at its positive input and the other input signal at its negative input.

28. The trifferential amplifier system of claim 27 in which said three output signals are derived from opposite polarity outputs of different pairs of input/output circuits.

29. The trifferential amplifier system of claim 23 in which said amplifier inputs are currents.

30. The trifferential amplifier system of claim 27 in which each said differential input/output circuit includes a differential pair.

31. The trifferential amplifier system of claim 30 in which each said differential pair includes a separate current source.

32. The trifferential amplifier system of claim 30 in which each said differential pair includes the same current source.

33. The trifferential amplifier system of claim 27 in which each said differential input/output circuit includes a voltage amplifier having a differential input and a differential output and each differential output includes a series impedance.

34. A multi-fferential amplifier system comprising:
an amplifier having a plurality of amplifier inputs and a plurality of amplifier outputs;
a plurality of input terminals for receiving a plurality of inputs and being interconnected with said amplifier inputs through a plurality of input impedances, respectively; and
a feedback network including a plurality of summing circuits for combining the a plurality of amplifier outputs in a plurality of different sets of groups each set numbering one fewer than said plurality, respectively, and feeding back the sum of each group of amplifier outputs to the remaining amplifier input for maintaining the difference between any group of amplifier outputs proportional to the difference of a corresponding group of inputs at said terminals and maintaining the average value of the amplifier outputs constant and unrelated to the amplifier inputs.

35. A trifferential amplifier comprising:
three differential input/output circuits responsive to three input signals and providing three output signals;
each input signal being shared between a different pair of the differential input/output circuits; each differential input/output circuit receiving one input signal at its positive input and the other input signal at its negative input.

36. The trifferential amplifier system of claim 35 in which said three output signals are derived from opposite polarity outputs of different pairs of input/output circuits.

37. The trifferential amplifier system of claim 35 in which each said differential input/output circuit includes a differential pair.

38. The trifferential amplifier system of claim 37 in which each said differential pair includes a separate current source.

39. The trifferential amplifier system of claim 37 in which each said differential pair includes the same current source.

40. The trifferential amplifier system of claim 35 in which each said differential input/output circuit includes a voltage amplifier having a differential input and a differential output and each differential output includes a series impedance.

41. A multi-fferential amplifier comprising:
a plurality of differential input/output circuits responsive to a plurality of input signals and providing a plurality of output signals;
each input signal being shared between a different set of the differential input/output circuits; in a plurality of different sets of groups each set numbering one fewer than said plurality,
each differential input/output circuit receiving one input signal at its positive input and the other input signal at its negative input.

42. The multi-fferential amplifier system of claim 41 in which said plurality of output signals are derived from opposite polarity outputs of different pairs of input/output circuits.

43. The multi-fferential amplifier system of claim 41 in which said amplifier inputs are currents.

44. The multi-fferential amplifier system of claim 41 in which each said differential input/output circuit includes a differential pair.

45. The multi-fferential amplifier system of claim 44 in which each said differential pair includes a separate current source.

46. The multi-fferential amplifier system of claim 44 in which each said differential pair includes the same current source.

47. The multi-fferential amplifier system of claim 41 in which each said differential input/output circuit includes a voltage amplifier having a differential input and a differential output and each differential output includes a series impedance.

* * * * *